(12) United States Patent
Okamoto et al.

(10) Patent No.: US 10,096,344 B2
(45) Date of Patent: Oct. 9, 2018

(54) HOLDING FRAME FOR ELECTRONIC DEVICE

(71) Applicant: FUJITSU LIMITED, Kawasaki-shi, Kanagawa (JP)

(72) Inventors: Shinichirou Okamoto, Yokohama (JP); Shinichirou Kouno, Machida (JP); Satoru Yamada, Kawasaki (JP); Atsushi Yamaguchi, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/849,733

(22) Filed: Dec. 21, 2017

(65) Prior Publication Data
US 2018/0197580 A1     Jul. 12, 2018

(30) Foreign Application Priority Data

Jan. 11, 2017   (JP) ................. 2017-002856

(51) Int. Cl.
| | |
|---|---|
| *G11B 33/08* | (2006.01) |
| *H05K 7/14* | (2006.01) |
| *G06F 1/18* | (2006.01) |
| *H05K 7/18* | (2006.01) |
| *G11B 33/12* | (2006.01) |

(52) U.S. Cl.
CPC ............... *G11B 33/08* (2013.01); *H05K 7/14* (2013.01); *H05K 7/18* (2013.01); *G06F 1/187* (2013.01); *G11B 33/124* (2013.01)

(58) Field of Classification Search
CPC ....... G11B 33/124; G11B 33/08; G06F 1/187; H05K 7/18; H05K 7/14
See application file for complete search history.

(56) References Cited

U.S. PATENT DOCUMENTS

| | | | | |
|---|---|---|---|---|
| 6,084,768 | A * | 7/2000 | Bolognia | G06F 1/184 248/636 |
| 6,088,222 | A * | 7/2000 | Schmitt | E05B 63/143 312/332.1 |
| 6,288,902 | B1 * | 9/2001 | Kim | G11B 33/08 206/701 |
| 6,356,441 | B1 * | 3/2002 | Claprood | G06F 1/184 312/332.1 |

(Continued)

FOREIGN PATENT DOCUMENTS

| | | |
|---|---|---|
| JP | 2006-139904 | 6/2006 |
| JP | 2014-146399 | 8/2014 |
| WO | 03/103356 | 12/2003 |

*Primary Examiner* — Dimary Lopez Cruz
*Assistant Examiner* — Abhishek Rathod
(74) *Attorney, Agent, or Firm* — Fujitsu Patent Center (57) ABSTRACT

A holding frame for an electronic device that is to be inserted and extracted into and from a pair of grooves formed in a chassis so as to face each other, the holding frame includes a pair of plates that are parallel to each other and that form portions of the holding frame, the portions extending along the grooves, three protrusions that are arranged along the grooves and that protrude from the plates toward the grooves, and two support portions that are arranged at portions of the holding frame each of which corresponds to a center portion between a corresponding two of the three protrusions, the two support portions supporting the electronic device between the plates and the electronic device.

4 Claims, 4 Drawing Sheets

(56) References Cited

U.S. PATENT DOCUMENTS

| | | | | |
|---|---|---|---|---|
| 8,259,441 B2* | 9/2012 | Chuang | ................... | G06F 1/187 |
| | | | | 361/679.31 |
| 8,971,036 B1* | 3/2015 | Lau | ........................... | G06F 1/20 |
| | | | | 361/679.34 |
| 2005/0039995 A1 | 2/2005 | Inoke et al. | | |
| 2005/0237707 A1* | 10/2005 | Connelly, Jr. | .......... | G11B 33/08 |
| | | | | 361/679.36 |
| 2006/0098332 A1* | 5/2006 | Lee | ...................... | G11B 25/043 |
| | | | | 360/97.19 |
| 2007/0223189 A1* | 9/2007 | Chiang | ................... | G06F 1/187 |
| | | | | 361/679.33 |
| 2008/0291618 A1* | 11/2008 | Sheng | ................... | G11B 33/08 |
| | | | | 361/679.34 |
| 2009/0059508 A1* | 3/2009 | Peng | ...................... | G06F 1/187 |
| | | | | 361/679.33 |
| 2011/0001409 A1* | 1/2011 | Peng | ...................... | G06F 1/187 |
| | | | | 312/301 |
| 2011/0175502 A1* | 7/2011 | Peng | ................... | G11B 33/124 |
| | | | | 312/223.2 |
| 2012/0293945 A1* | 11/2012 | Wang | ..................... | G11B 33/08 |
| | | | | 361/679.33 |
| 2013/0078838 A1* | 3/2013 | Lin | ........................ | G06F 1/187 |
| | | | | 439/345 |

* cited by examiner

HOLDING FRAME FOR ELECTRONIC DEVICE

CROSS-REFERENCE TO RELATED APPLICATION

This application is based upon and claims the benefit of priority of the prior Japanese Patent Application No. 2017-002856, filed on Jan. 11, 2017, the entire contents of which are incorporated herein by reference.

FIELD

The embodiment discussed herein is related to a holding frame for an electronic device.

BACKGROUND

Various members that suppress vibration are used in a hard disk device.

In recent years, electronic devices have been increasing in performance. With the increase in performance of electronic devices, for example, operating mechanisms of electronic devices, such as hard disk devices, each of which has a mechanical operating mechanism have been constructed with higher precision. Accordingly, it is desirable that a member that suppresses vibration applied to an electronic device having a mechanical operating mechanism be capable of further suppressing vibration. However, for example, various vibration damping members, such as a vibration damping rubber and a plate spring, are arranged locally at positions at which an electronic device is supported, and this leaves only little room for further vibration suppression.

The followings are reference documents:
[Document 1] Japanese Laid-open Patent Publication No. 2006-139904;
[Document 2] Japanese Laid-open Patent Publication No. 2014-146399; and
[Document 3] International Publication Pamphlet No. 2003/103356.

SUMMARY

According to an aspect of the invention, a holding frame for an electronic device that is to be inserted and extracted into and from a pair of grooves formed in a chassis so as to face each other, the holding frame includes a pair of plates that are parallel to each other and that form portions of the holding frame, the portions extending along the grooves, three protrusions that are arranged along the grooves and that protrude from the plates toward the grooves, and two support portions that are arranged at portions of the holding frame each of which corresponds to a center portion between a corresponding two of the three protrusions, the two support portions supporting the electronic device between the plates and the electronic device, wherein two first protrusions among the three protrusions that are positioned at opposite ends each have a height obtained by subtracting a dimension of a gap between one of the plates and the electronic device, the gap being defined by the support portions, and a thickness dimension of each of the plates from a dimension of a gap between one of the grooves and the electronic device, wherein a second protrusion among the three protrusions that is located between the two first protrusions has a height larger than the height of each of the first protrusions, and wherein the dimension of the gap between the one of the plates and the electronic device, which is defined by the support portions, is larger than a dimension obtained by subtracting the height of each of the first protrusions from the height of the second protrusion.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENT

An embodiment will be described below. The embodiment described below is a merely example, and the technical scope of the present disclosure is not limited to the following embodiment.

Figure 1:
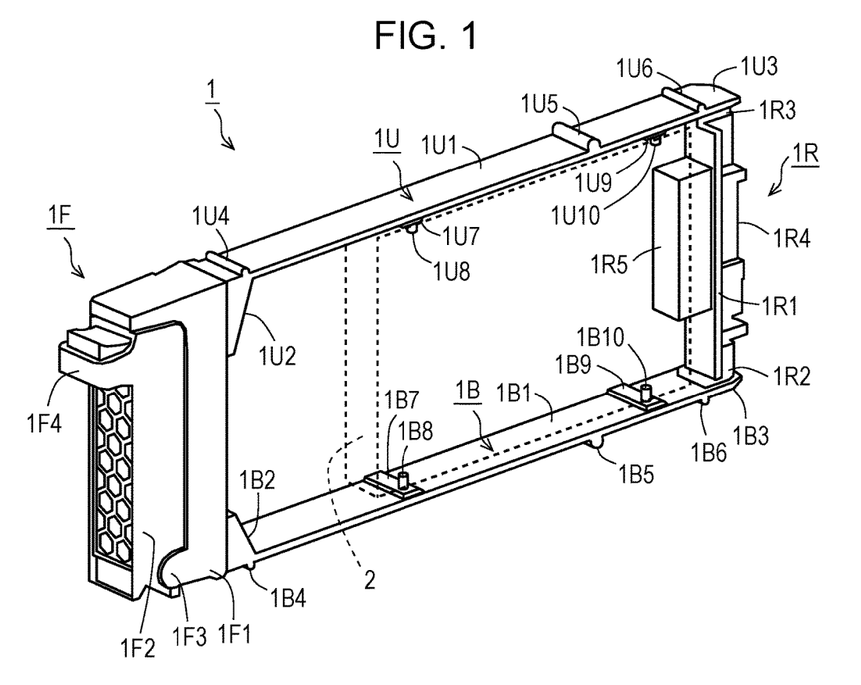
FIG. 1 is a perspective view of a holding frame for an electronic device according to an embodiment.

FIG. 1 is a perspective view of a holding frame for an electronic device according to the embodiment. A holding frame 1 is a rectangular frame that holds a hard disk device 2. The holding frame 1 includes a mounting and unmounting portion 1F, a plate 1U, a connecting portion 1R, and a plate 1B that form four sides of the holding frame 1. The mounting and unmounting portion 1F and the connecting portion 1R have a positional relationship in which the mounting and unmounting portion 1F and the connecting portion 1R are symmetrically positioned in a front-rear direction with a center portion of the holding frame 1 interposed therebetween. The plate 1U and the plate 1B have a positional relationship in which the plate 1U and the plate 1B are symmetrically positioned in a top-bottom direction with the center portion of the holding frame 1 interposed therebetween. The plate 1U and the plate 1B are plates each having an elongated rectangular shape and are paired with each other so as to be arranged parallel to each other. A front end portion 1U2 of the plate 1U is fixed to an upper portion of the mounting and unmounting portion 1F. A front end portion 1B2 of the plate 1B is fixed to a lower portion of the mounting and unmounting portion 1F. A rear end portion 1U3 of the plate 1U is fixed to an upper end portion 1R3 of the connecting portion 1R. A rear end portion 1B3 of the plate 1B is fixed to a lower end portion 1R2 of the connecting portion 1R. These portions are fixed to their respective portions by screws, rivets, welding, or other various fixing units.

Note that the holding frame 1 is inserted and extracted into and from a chassis that has a plurality of slots into and from which various functional modules may be inserted and extracted in accordance with user demands. Consequently, the holding frame 1 is not limited to holding the hard disk device 2. For example, the holding frame 1 may hold not the hard disk device 2 but a different electronic device that has a mechanical operating mechanism or an electronic device, such as a central processing unit (CPU) or memory, that does not have a mechanical operating mechanism.

The mounting and unmounting portion 1F is a portion that is to be held by an operator who handles the holding frame 1 when the operator inserts and extracts the holding frame 1 into and from one of the slots of the chassis, and the mounting and unmounting portion 1F includes a mounting and unmounting portion main body 1F1 and a stopper 1F2. The front end portion 1U2 of a plate main body 1U1 is fixed to an upper portion of the mounting and unmounting portion main body 1F1. The front end portion 1B2 of a plate main body 1B1 is fixed to a lower portion of the mounting and unmounting portion main body 1F1. The mounting and unmounting portion main body 1F1 forms a portion corresponding to one side of a rectangular frame forming the entire mounting and unmounting portion 1F. The stopper 1F2 is a member that is in charge of fixing the holding frame 1 that has been inserted in one of the slots of the chassis to the slot, and the stopper 1F2 is attached to the mounting and unmounting portion main body 1F1 in such a manner as to be pivotable around a hinge 1F3. A handle 1F4 is formed at a free end of the stopper 1F2. Accordingly, an operator who handles the holding frame 1 holds the handle 1F4 with their fingers and moves the handle 1F4 back and forth, so that the stopper 1F2 is caused to pivot around the hinge 1F3 so as to stand upright or so as to be tilted forward. When the stopper 1F2 stands upright in a state where the holding frame 1 is inserted in one of the slots, the holding frame 1 is fixed to the slot.

The connecting portion 1R includes a connector 1R5 that is to be fitted into a connector of the hard disk device 2 and a connector 1R4 that is to be fitted into a connector disposed in the chassis. The connector 1R5 and the connector 1R4 are fixed to a connecting portion main body 1R1 that forms a principal portion of the connecting portion 1R. A terminal of the connector 1R5 is electrically connected to a terminal of the connector 1R4. Thus, when the holding frame 1 is inserted into the chassis, the hard disk device 2 is electrically connected to the connector of the chassis via the connector 1R5 and the connector 1R4. Note that the rear end portion 1U3 of the plate 1U is fixed to the upper end portion 1R3 of the connecting portion main body 1R1. The rear end portion 1B3 of the plate 1B is fixed to the lower end portion 1R2 of the connecting portion main body 1R1.

The plate 1U is a plate that is to be interposed between one of grooves formed in the slots of the chassis and the hard disk device 2 and includes the plate main body 1U1 having an elongated plate-like shape. Three protrusions 1U4, 1U5, and 1U6 are formed on the top surface of the plate main body 1U1 so as to be arranged along one of the grooves of the slots and protrude from the plate main body 1U1 toward the groove. A protrusion 1U7 is formed on a portion of the bottom surface of the plate main body 1U1, the portion corresponding to a center portion between the protrusion 1U4 and the protrusion 1U5, and the protrusion 1U7 supports the hard disk device 2 at a position between the plate main body 1U1 and the hard disk device 2. A fixing pin 1U8 that is to be fitted into a fixing hole 2H1 of the hard disk device 2 is disposed on the protrusion 1U7. A protrusion 1U9 is formed on a portion of the bottom surface of the plate main body 1U1, the portion corresponding to a center portion between the protrusion 1U5 and the protrusion 1U6, and the protrusion 1U9 supports the hard disk device 2 at a position between the plate main body 1U1 and the hard disk device 2. A fixing pin 1U10 that is to be fitted into a fixing hole 2H2 of the hard disk device 2 is disposed on the protrusion 1U9.

The plate 1B has a shape similar to that of the plate 1U. In other words, the plate 1B is a plate that is to be interposed between one of the grooves formed in the slots of the chassis and the hard disk device 2 and includes the plate main body 1B1 having an elongated plate-like shape. Three protrusions 1B4, 1B5, and 1B6 are formed on the bottom surface of the plate main body 1B1 so as to be arranged along one of the grooves of the slots and protrude from the plate main body 1B1 toward the groove. In addition, a protrusion 1B7 is formed on a portion of the top surface of the plate main body 1B1, the portion corresponding to a center portion between the protrusion 1B4 and the protrusion 1B5, and the protrusion 1B7 supports the hard disk device 2 at a position between the plate main body 1B1 and the hard disk device 2. A fixing pin 1B8 that is to be fitted into a hole of the hard disk device 2 is disposed on the protrusion 1B7. A protrusion 1B9 is formed on a portion of the top surface of the plate main body 1B1, the portion corresponding to a center portion between the protrusion 1B5 and the protrusion 1B6, and the protrusion 1B9 supports the hard disk device 2 at a position between the plate main body 1B1 and the hard disk device 2. A fixing pin 1B10 that is to be fitted into a hole of the hard disk device 2 is disposed on the protrusion 1B9.

Figure 2:
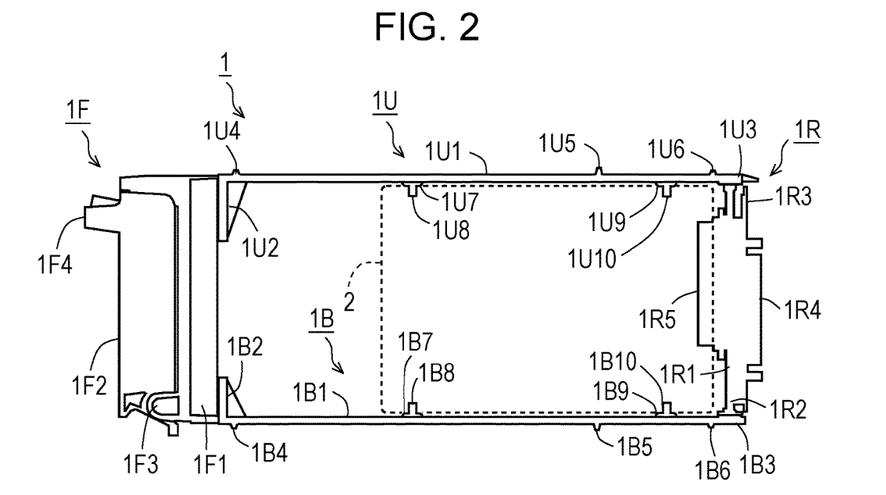
FIG. 2 is a side view of the holding frame.

FIG. 2 is a side view of the holding frame 1. As seen from FIG. 2, the protrusion 1U7 protrudes from the bottom surface of the plate main body 1U1 toward the hard disk device 2 in such a manner that a gap is generated between the plate main body 1U1 and the hard disk device 2 and supports the hard disk device 2. The protrusion 1B7 protrudes from the top surface of the plate main body 1B1 toward the hard disk device 2 in such a manner that a gap is generated between the plate main body 1B1 and the hard disk device 2 and supports the hard disk device 2. Note that, in the present embodiment, the hard disk device 2 is held by the holding frame 1 as a result of being fitted into the fixing pins 1U8, 1U10, 1B8, and 1B10. However, for example, the hard disk device 2 may be fixed to the plate main body 1U1 and the plate main body 1B1 by screws or other fixing units. In the case where the hard disk device 2 is fixed to the plate main body 1U1 and the plate main body 1B1 by screws, ring-shaped members, washers, spacers, or other alternative units may be employed instead of protrusions as the protrusions 1U7, 1U9, 1B7, and 1B9.

Figure 3:
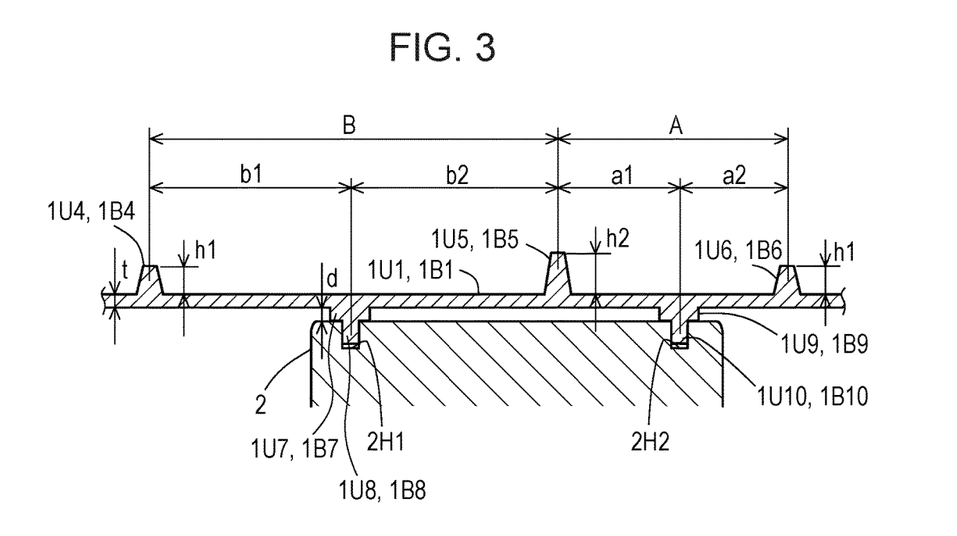
FIG. 3 is a diagram illustrating the positional relationship between protrusions and the heights of the protrusions.

FIG. 3 is a diagram illustrating the positional relationship between the protrusions and the heights of the protrusions. Each of the protrusion 1U4 and the protrusion 1U6 has a height h1 obtained by subtracting a dimension d of a gap between the plate main body 1U1 and the hard disk device 2, the gap being defined by the protrusions 1U7 and 1U9, and a thickness dimension t of the plate main body 1U1 from a dimension of a gap between one of the grooves of the slots and the hard disk device 2. The protrusion 1U5 has a height h2 that is larger than the height h1 of each of the protrusions 1U4 and 1U6. These conditions are set for causing the plate 1U to deform so as to exhibit a spring property in a state where the holding frame 1 is inserted in one of the slots.

The dimension d of the gap between the plate main body 1U1 and the hard disk device 2, which is defined by the protrusions 1U7 and 1U9, is larger than a dimension obtained by subtracting the height h1 of the protrusion 1U4 from the height h2 of the protrusion 1U5. This is because, if the dimension d is equal to or smaller than the dimension obtained by subtracting the height h1 from the height h2, there is a possibility that the plate main body 1U1 that has been deformed will come into contact with the hard disk device 2 in a state where the holding frame 1 is inserted in one of the slots.

Note that a dimension of the fixing pin 1U8 is set in such a manner that the fixing pin 1U8 is fitted into the fixing hole 2H1 of the hard disk device 2. A dimension of the fixing pin 1U10 is set in such a manner that the fixing pin 1U8 is fitted into the fixing hole 2H2 of the hard disk device 2.

The protrusion 1U9 is positioned at the center portion between the protrusion 1U5 and the protrusion 1U6. Thus, a distance a1 between the protrusion 1U5 and the protrusion 1U9 is equal to a distance a2 between the protrusion 1U9 and the protrusion 1U6. The protrusion 1U7 is positioned at the center portion between the protrusion 1U4 and the protrusion 1U5. Thus, a distance b1 between the protrusion 1U4 and the protrusion 1U7 is equal to a distance b2 between the protrusion 1U5 and the protrusion 1U7. The protrusion 1U5 is positioned so as to be closer to the connector 1R5 than a center portion between the protrusion 1U4 and the protrusion 1U6 is. Thus, a distance A between the protrusion 1U6 and the protrusion 1U5 is smaller than a distance B between the protrusion 1U5 and the protrusion 1U4.

In other words, when the positional relationship between the protrusions and the heights of the protrusions are expressed by formulas, the plate 1U is manufactured so as to satisfy the following conditions.

$$h1+t+d \approx gap \text{ between hard disk device 2 and chassis}$$

$$h2 > h1$$

$$h2 - h1 < d$$

$$a1 \approx a2, b1 \approx b2$$

$$B > A$$

Note that the positional relationship between the protrusions formed on the plate 1B is similar to the positional relationship between the protrusions formed on the plate 1U, and the heights of the protrusions formed on the plate 1B are similar to the heights of the protrusions formed on the plate 1U. Regarding the above-mentioned conditions that relate to the positional relationship between the protrusions and to the heights of the protrusions, an error of about 10% is within an acceptable range, though it depends on a material of each of the plate main bodies 1U1 and 1B1, the thickness of each of the plate main bodies 1U1 and 1B1, a desired vibration damping ability of the holding frame 1, and other various design conditions. In addition, the error may be higher than 10%.

Figure 4:
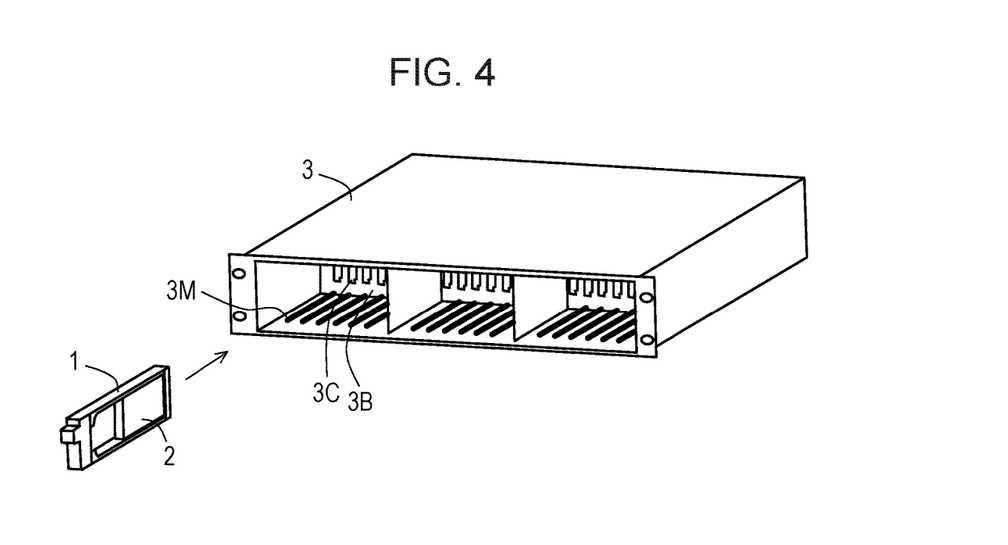
FIG. 4 is a diagram illustrating a chassis into which the holding frame that holds a hard disk device is inserted.

FIG. 4 is a diagram illustrating the chassis into which the holding frame 1 that holds the hard disk device 2 is inserted. In a chassis 3, grooves 3M are formed in upper portions and lower portions of slots, one of which receives the holding frame 1, in such a manner that each of the grooves 3M faces a corresponding one of the grooves 3M. Connectors 3C are fixed to a back panel 3B in the back of the slots of the chassis 3. Thus, when the holding frame 1 is inserted into one of the slots of the chassis 3, the connector 1R4 is fitted into one of the connectors 3C.

Figure 5:
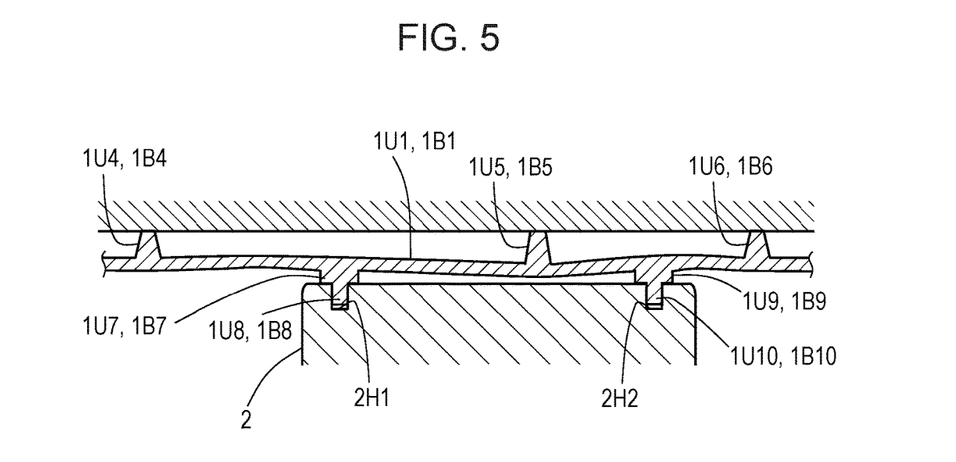
FIG. 5 is a diagram illustrating a state of a plate main body in a state where the holding frame is inserted in one of slots of the chassis.

FIG. 5 is a diagram illustrating the state of the plate main bodies 1U1 and 1B1 in a state where the holding frame 1 is inserted in one of the slots of the chassis 3. The height h1 of each of the protrusions 1U4 and 1U6 is a height obtained by subtracting the dimension d of the gap between the plate main body 1U1 and the hard disk device 2, which is defined by the protrusions 1U7 and 1U9, and the thickness dimension t of the plate main body 1U1 from the dimension of a gap between one of the grooves 3M and the hard disk device 2 in the state where the holding frame 1 is inserted in one of the slots of the chassis 3. The height h2 of the protrusion 1U5 is larger than the height h1 of each of the protrusions 1U4 and 1U6. Consequently, when the holding frame 1 is inserted into one of the slots of the chassis 3, the protrusion 1U5 is pushed by the bottom of a corresponding one of the grooves 3M so as to move toward the hard disk device 2. When the protrusion 1U5 is pushed toward the hard disk device 2, a force that pushes the protrusion 1U4 toward the groove 3M is applied to the protrusion 1U4 while the protrusion 1U7 serves as a fulcrum. In addition, when the protrusion 1U5 is pushed toward the hard disk device 2, a force that pushes the protrusion 1U6 toward the groove 3M is applied to the protrusion 1U6 while the protrusion 1U9 serves as a fulcrum. Therefore, the plate main body 1U1 is elastically deformed into, for example, a shape illustrated in FIG. 5.

Here, a portion of the plate main body 1U1 that is located between the protrusion 1U4 and the protrusion 1U5 will now be discussed. Since the protrusion 1U7 is located at the center portion between the protrusion 1U4 and the protrusion 1U5, the degree of vibration that is transmitted to the plate main body 1U1 from the protrusion 1U4 and the protrusion 1U5 and that reaches the protrusion 1U7 is smaller than that in the case where the protrusion 1U7 is positioned closer to one of the protrusion 1U4 and the protrusion 1U5 than the other. In other words, when the protrusion 1U7 is located at the center portion between the protrusion 1U4 and the protrusion 1U5, the entire portion of the plate main body 1U1, which is located between the protrusion 1U4 and the protrusion 1U5, exhibits a function similar to a plate spring that suppresses vibration that is transmitted to the protrusion 1U7 from the protrusion 1U4 and the protrusion 1U5.

A portion of the plate main body 1U1 that is located between the protrusion 1U5 and the protrusion 1U6 will now be discussed. Since the protrusion 1U9 is located at the center portion between the protrusion 1U5 and the protrusion 1U6, the degree of vibration that is transmitted to the plate main body 1U1 from the protrusion 1U5 and the protrusion 1U6 and that reaches the protrusion 1U9 is smaller than that in the case where the protrusion 1U9 is positioned closer to one of the protrusion 1U5 and the protrusion 1U6 than the other. In other words, when the protrusion 1U9 is located at the center portion between the protrusion 1U5 and the protrusion 1U6, the entire portion of the plate main body 1U1, which is located between the protrusion 1U5 and the protrusion 1U6, exhibits a function similar to a plate spring that suppresses vibration that is transmitted to the protrusion 1U9 from the protrusion 1U5 and the protrusion 1U6.

Since the protrusion 1U4 is positioned in the vicinity of the front end portion 1U2, and the protrusion 1U6 is positioned in the vicinity of the rear end portion 1U3, the entire plate main body 1U1 functions like a plate spring. Therefore, the plate main body 1U1 provides a vibration damping effect higher than that of a vibration damping member that is disposed at a position at which the hard disk device 2 is locally supported. The plate main body 1B1 provides a vibration damping effect similar to that of the plate main body 1U1.

Note that, although the thickness dimension t of the plate main body 1U1 is uniform from the protrusion 1U4 to the protrusion 1U6, the distance A between the protrusion 1U6 and the protrusion 1U5 is smaller than the distance B between the protrusion 1U5 and the protrusion 1U4, and thus, the vibration damping effect provided by the portion of the plate main body 1U1 between the protrusion 1U5 and the protrusion 1U6 is smaller than the vibration damping effect provided by the portion of the plate main body 1U1 between the protrusion 1U4 and the protrusion 1U5. This configuration is employed in order to cause the vibration damping effect provided by the protrusion 1U7 to be more effectively exerted than the vibration damping effect provided by the protrusion 1U9 given that the movement of the hard disk device 2 on the side on which the connector 1R5 is present is restrained by the connector 1R5 as a result of the connector of the hard disk device 2 being fitted into the connector 1R5. However, such consideration is unnecessary in the case where the hard disk device 2 is electrically connected to the connector 1R4 not via a connector such as the connector 1R5, but via, for example, a wiring film or a different electrically-conductive flexible member. Therefore, the vibration damping effect provided by the portion of the plate main body 1U1 between the protrusion 1U5 and the protrusion 1U6 may be set to be equal to the vibration damping effect provided by the portion of the plate main body 1U1 between the protrusion 1U4 and the protrusion 1U5 by, for example, setting the distance A between the protrusion 1U6 and the protrusion 1U5 to be equal to the distance B between the protrusion 1U5 and the protrusion 1U4.

Figure 6:
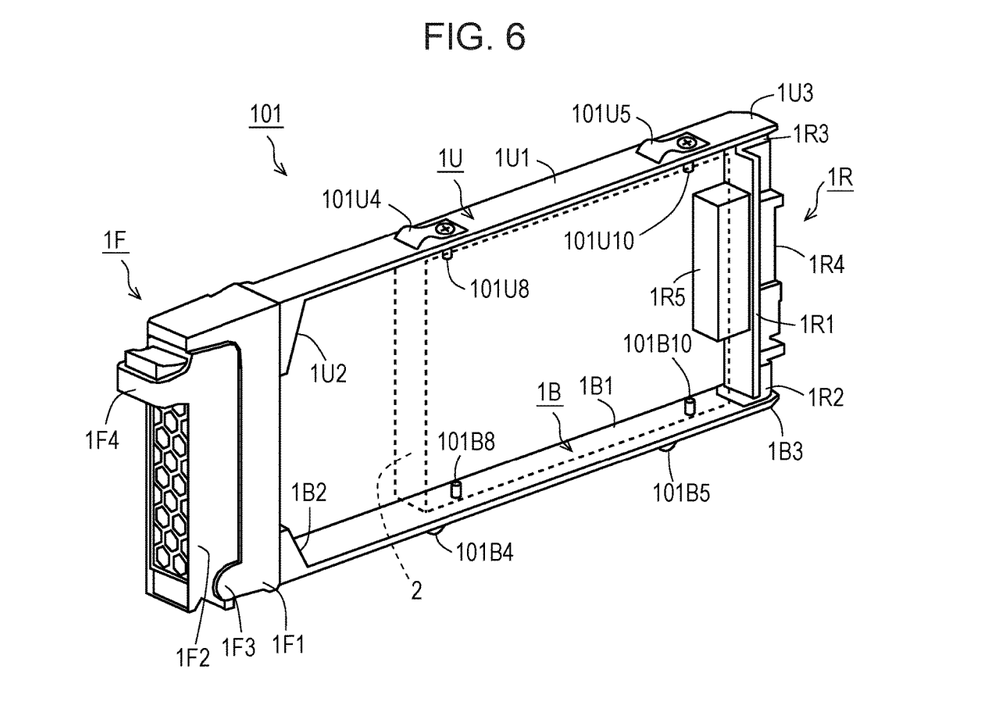
FIG. 6 is a perspective view of a holding frame for an electronic device according to a comparative example.

The effects of the holding frame 1 are examined, and results of the examination will be described below. FIG. 6 is a perspective view of a holding frame for an electronic device according to a comparative example. The holding frame 101 according to the comparative example is configured in the same manner as the holding frame 1, except with regard to the following matters. A holding frame 101 according to the comparative example does not include the protrusions 1U4, 1U5, 1U6, 1U7, 1U8, 1U9, 1U10, 1B4, 1B5, 1B6, 1B7, 1B8, 1B9, and 1B10, which are included in the holding frame 1. Instead of these protrusions, plate springs 101U4 and 101U5 are disposed on the top surface of the plate main body 1U1, and plate springs 101B4 and 101B5 are disposed on the bottom surface of the plate main body 1B1. The hard disk device 2 is fixed to the holding frame 101 by screws 101U8 and 101U10, which respectively fix the plate springs 101U4 and 101U5 to the plate main body 1U1, and screws 101B8 and 101B10, which respectively fix the plate springs 101B4 and 101B5 to the plate main body 1B1. Therefore, components of the holding frame 101 common to the holding frame 1 are denoted by reference signs the same as those in the above-described embodiment, and detailed descriptions thereof will be omitted.

The plate spring 101U4 is a plate spring that is locally fixed to the top surface of the plate main body 1U1 by the screw 101U8 and is a member that is brought into contact with one of the grooves 3M when the holding frame 101 is inserted into one of the slots of the chassis 3. The plate spring 101U5 is a plate spring that is locally fixed to the top surface of the plate main body 1U1 by the screw 101U10 and is a member that is brought into contact with one of the grooves 3M when the holding frame 101 is inserted into one of the slots of the chassis 3. The plate spring 101B4 is a plate spring that is locally fixed to the bottom surface of the plate main body 1B1 by the screw 101B8 and is a member that is brought into contact with one of the grooves 3M when the holding frame 101 is inserted into one of the slots of the chassis 3. The plate spring 101B5 is a plate spring that is locally fixed to the bottom surface of the plate main body 1B1 by the screw 101B10 and is a member that is brought into contact with one of the grooves 3M when the holding frame 101 is inserted into one of the slots of the chassis 3.

Figure 7:
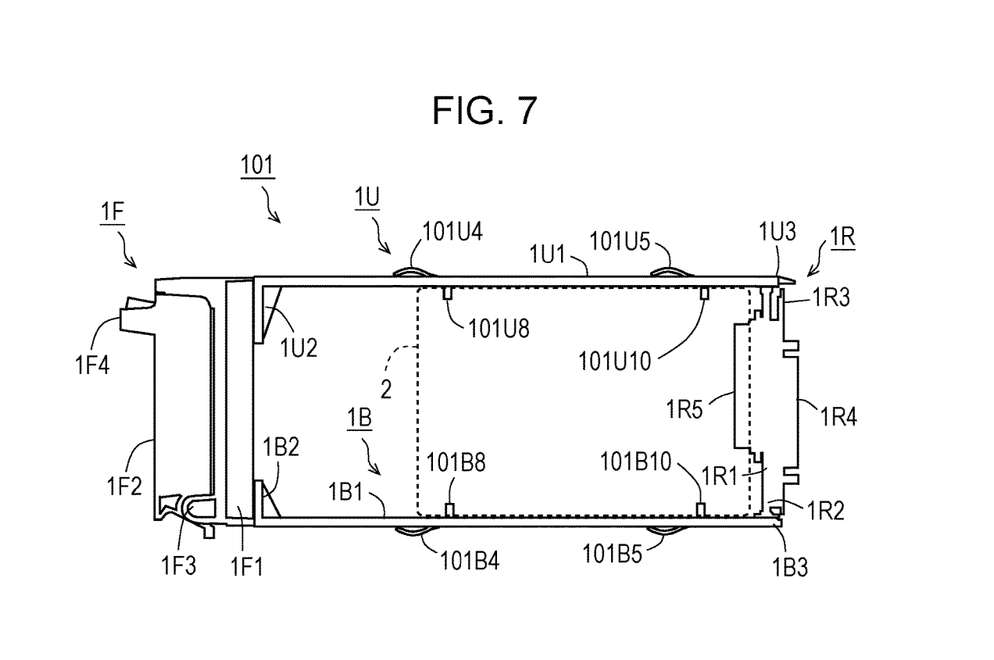
FIG. 7 is a side view of the holding frame.

FIG. 7 is a side view of the holding frame 101. As seen from FIG. 7, each of the plate springs 101U4 and 101U5 is a plate spring that is locally curved upward on the top surface of the plate main body 1U1. Each of the plate springs 101B4 and 101B5 is a plate spring that is locally curved downward on the bottom surface of the plate main body 1B1. Consequently, when the holding frame 101 is inserted into one of the slots of the chassis 3, the holding frame 101 is supported by the plate springs 101U4, 101U5, 101B4, and 101B5, each of which is brought into contact with one of the grooves 3M. Therefore, vibration that is transmitted from the grooves 3M to the plate main body 1U1 via the plate springs 101U4 and 101U5 is absorbed by elastic deformation of the plate springs 101U4 and 101U5. In addition, vibration that is transmitted from the grooves 3M to the plate main body 1B1 via the plate springs 101B4 and 101B5 is absorbed by elastic deformation of the plate springs 101B4 and 101B5.

Figure 8:
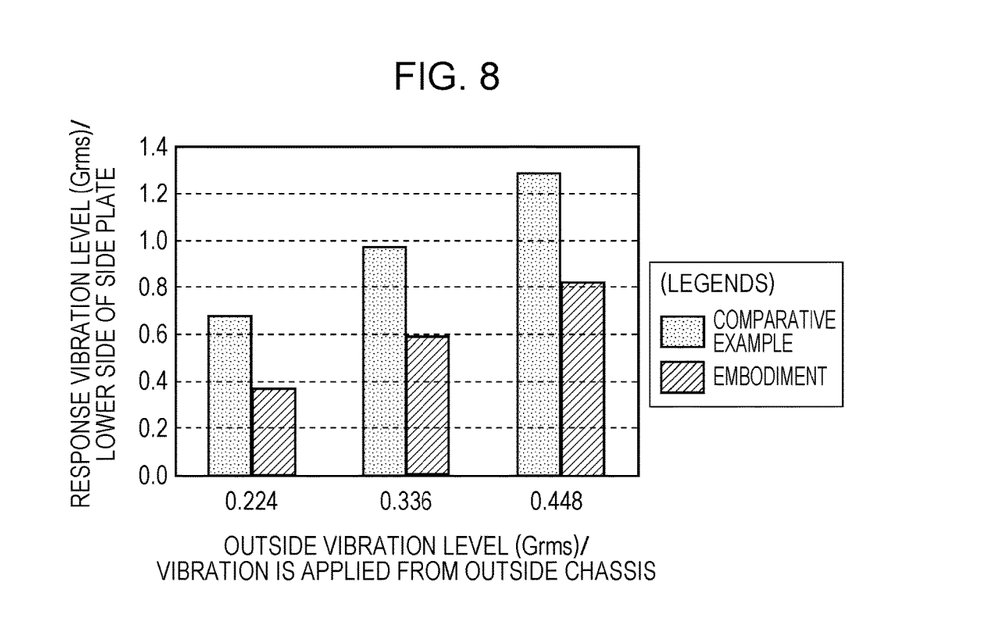
FIG. 8 is a graph illustrating the degree of vibration that is transmitted from the chassis to each plate.

FIG. 8 is a graph illustrating the degree of vibration that is transmitted from the chassis 3 to each of the plate 1U according to the embodiment and the plate 1U according to the comparative example. The horizontal axis of FIG. 8 denotes the level of vibration that is applied to the chassis 3 from outside in order to simulate vibration of the chassis 3 in the examination. The vertical axis of FIG. 8 denotes the level of response vibration of each of the plate 1U according to the embodiment and the plate 1U according to the comparative example with respect to the vibration of the chassis 3. As seen from the graph in FIG. 8, it is understood that the holding frame 1 may reduce the vibration transmitted from the chassis 3 to the plate 1U by about 40% more than the holding frame 101 may reduce the vibration.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A holding frame for an electronic device that is to be inserted and extracted into and from a pair of grooves formed in a chassis so as to face each other, the holding frame comprising:

a pair of plates that are parallel to each other and that form portions of the holding frame, the portions extending along the grooves;

three protrusions that are arranged along the grooves and that protrude from each of the plates toward the grooves;

and two support portions that are arranged at portions of the holding frame each of which corresponds to a center portion between a corresponding two of the three protrusions, the two support portions supporting the electronic device between the plates and the electronic device, wherein two first protrusions among the three protrusions that are positioned at opposite ends each have a height obtained by subtracting a dimension of a gap between one of the plates and the electronic device, the gap being defined by the support portions, and a thickness dimension of each of the plates from a dimension of a gap between one of the grooves and the electronic device, wherein a second protrusion among the three protrusions that is located between the two first protrusions has a height larger than the height of each of the first protrusions, and wherein the dimension of the gap between the one of the plates and the electronic device, which is defined by the support portions, is larger than a dimension obtained by subtracting the height of one of the first protrusions from the height of the second protrusion.

2. The holding frame for an electronic device according to claim 1, wherein the electronic device includes a connector that is disposed on a side on which the electronic device is to be inserted into the chassis, and wherein the second protrusion is positioned so as to be closer to the connector than the center portion between the two first protrusions is.

3. The holding frame for an electronic device according to claim 1, wherein the two support portions are protrusions that protrude from the plates toward the electronic device.

4. The holding frame for an electronic device according to claim 1, wherein the electronic device is a hard disk device.

* * * * *